(12) United States Patent
Murozuka

(10) Patent No.: US 11,348,657 B2
(45) Date of Patent: May 31, 2022

(54) STORAGE CONTROL CIRCUIT, STORAGE APPARATUS, IMAGING APPARATUS, AND STORAGE CONTROL METHOD

(71) Applicant: SONY SEMICONDUCTOR SOLUTIONS CORPORATION, Kanagawa (JP)

(72) Inventor: Masaki Murozuka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/980,688

(22) PCT Filed: Dec. 7, 2018

(86) PCT No.: PCT/JP2018/045048
§ 371 (c)(1),
(2) Date: Sep. 14, 2020

(87) PCT Pub. No.: WO2019/181094
PCT Pub. Date: Sep. 26, 2019

(65) Prior Publication Data
US 2021/0012853 A1 Jan. 14, 2021

(30) Foreign Application Priority Data
Mar. 22, 2018 (JP) .............................. JP2018-053872

(51) Int. Cl.
G11C 29/42 (2006.01)
G11C 29/18 (2006.01)
G11C 29/44 (2006.01)
(52) U.S. Cl.
CPC .............. G11C 29/42 (2013.01); G11C 29/18 (2013.01); G11C 29/44 (2013.01); G11C 2029/4402 (2013.01)

(58) Field of Classification Search
CPC .......... G11C 29/42; G11C 29/18; G11C 29/44
See application file for complete search history.

(56) References Cited

U.S. PATENT DOCUMENTS

| 2003/0106010 | A1  | 6/2003 | Fujioka et al. |
| 2015/0194984 | A1  | 7/2015 | Tsuboi et al. |
| 2017/0255509 | A1* | 9/2017 | Tsuboi ................ G06F 11/1044 |

FOREIGN PATENT DOCUMENTS

| CN | 1421871 A | 6/2003 |
| CN | 104765650 A | 7/2015 |

(Continued)

OTHER PUBLICATIONS

International Search Report and Written Opinion of PCT Application No. PCT/JP2018/045048, dated Mar. 5, 2019, 07 pages of ISRWO.

Primary Examiner — Alfredo Bermudez Lozada
(74) Attorney, Agent, or Firm — Chip Law Group

(57) ABSTRACT

It is aimed to detect an error of an address abnormality in a memory. An address error detection information generating unit generates address error detection information for detecting an error relating to an access address for a memory. A control part stores the address error detection information generated by the address error detection information generating unit in the memory at a time of write access. An error detecting part compares the address error detection information generated by the address error detection information generating unit with the address error detection information stored in the memory to detect an error at a time of read access.

12 Claims, 14 Drawing Sheets

(56) References Cited

FOREIGN PATENT DOCUMENTS

| | | |
|---|---:|---|
| EP | 2894566 A1 | 7/2015 |
| JP | 07-105102 A | 4/1995 |
| JP | 2003-157696 A | 5/2003 |
| JP | 2008-112224 A | 5/2008 |
| JP | 2015-130085 A | 7/2015 |
| KR | 10-2015-0083028 A | 7/2015 |

\* cited by examiner

FIG. 10

| CASE | STATE | DIAGNOSIS RESULTS | | | REMARKS |
|---|---|---|---|---|---|
| | | SEC | AP | DED | |
| 1 | NORMAL | 0 | 0 | 0 | — |
| 2 | 1-BIT FAILURE (DATA+SEC) | ≠0 | 0 | 1 | CORRECTABLE |
| 3 | 1-BIT FAILURE (DED) | 0 | 0 | 1 | NO ABNORMALITY IN DATA |
| 4 | 2-BIT FAILURE (DATA+SEC) | ≠0 | 0 | 0 | CRITICAL ERROR |
| 5 | 2-BIT FAILURE ((DATA+SEC)+DED) | ≠0 | 0 | 0 | CRITICAL ERROR |
| 6 | 1-BIT FAILURE (ADDRESS PARITY) | 0 | 1 | 1 | NO ABNORMALITY IN DATA ADDRESS PARITY CELL ERROR |
| 7 | 2-BIT FAILURE ((DATA+SEC)+ADDRESS PARITY) | ≠0 | 1 | 0 | CORRECTABLE FOR DATA |
| 8 | 2-BIT FAILURE (ADDRESS PARITY+DED) | 0 | 1 | 0 | CRITICAL ERROR |
| 9 | TRUE ADDRESS ERROR | 0 | 1 | 0 | CRITICAL ERROR |

Cases 2–8: MEMORY CELL ERROR

STORAGE CONTROL CIRCUIT, STORAGE APPARATUS, IMAGING APPARATUS, AND STORAGE CONTROL METHOD

CROSS REFERENCE TO RELATED APPLICATIONS

This application is a U.S. National Phase of International Patent Application No. PCT/JP2018/045048 filed on Dec. 7, 2018, which claims priority benefit of Japanese Patent Application No. JP 2018-053872 filed in the Japan Patent Office on Mar. 22, 2018. Each of the above-referenced applications is hereby incorporated herein by reference in its entirety.

TECHNICAL FIELD

The present technology relates to a storage apparatus. In detail, the present technology relates to a storage control circuit, a storage apparatus, an imaging apparatus, and a storage control method that perform error detection.

BACKGROUND ART

A memory is used in a variety of apparatuses, and failure diagnosis is an important technology. In particular, cameras for in-vehicle use need to be developed in line with the ISO26262 development process, and a safety mechanism must be arranged to suppress the risk of failure due to the occurrence of malfunction in a memory used for signal processing and system applications. Conventionally, a parity, an error correction code (ECC), and the like have been used to detect an error that happens in a memory. For example, an error detection apparatus that performs a failure diagnosis for an error detection function has been proposed (for example, see Patent Document 1).

CITATION LIST

Patent Document

Patent Document 1: Japanese Patent Application Laid-Open No. 2008-112224

SUMMARY OF THE INVENTION

Problems to be Solved by the Invention

In the above-mentioned prior art, a plurality of pieces of data is switched to perform a failure diagnosis for the error detection function of a parity bit generating unit and a parity check unit. However, in this prior art, the error detection for a data string is targeted, and the error detection when the address is abnormal cannot be performed.

The present technology has been made in view of such a situation, and an object of the present technology is to detect an error of an address abnormality in a memory.

Solutions to Problems

The present technology has been made to remove the above difficulties, and a first aspect of the present technology is a storage control circuit, a storage apparatus, an imaging apparatus, and a storage control method each including: an address error detection information generating unit that generates address error detection information for detecting an error relating to an access address for a memory; a control part that stores the generated address error detection information in the memory at a time of write access; and an error detecting part that compares the generated address error detection information with the address error detection information stored in the memory to detect an error at a time of read access. This brings about an action that the address error detection information stored in the memory at the time of write access is referred to at the time of read access to detect an error relating to the access address.

Furthermore, in this first aspect, the control part may store the generated address error detection information in the memory in association with write data at the time of write access. More specifically, the control part may store the generated address error detection information in the memory at a same address as an address of the write data at the time of write access.

In addition, in this first aspect, the address error detection information may include an address parity which is a parity of the access address for the memory. In this case, the address error detection information may further include a parity of the address parity.

Furthermore, in this first aspect, a code generating unit that generates a 2-bit error detection code from the write data, a 1-bit error correction code of the write data, and the address error detection information at the time of write access may be further provided, and the control part may further store the generated 2-bit error detection code in the memory at the time of write access. This brings about an action that the address error detection information is included into the correction code of data. In this case, the error detecting part may detect that an uncorrectable error has occurred, in a case where no error is detected by the 1-bit error correction code and the 2-bit error detection code and an error is detected by the address error detection information.

In addition, in this first aspect, the address error detection information generating unit may generate the address error detection information for both of write access and read access. Meanwhile, the address error detection information generating unit may separately include a write address error detection information generating unit that generates the address error detection information at the time of write access, and a read address error detection information generating unit that generates the address error detection information at the time of read access.

Effects of the Invention

According to the present technology, it is possible to attain an excellent effect that an error of an address abnormality in a memory can be detected. Note that the effects described herein are not necessarily limited and any effects described in the present disclosure may be applied.

BRIEF DESCRIPTION OF DRAWINGS

FIG. 10 is a diagram illustrating an example of a truth table of states of a memory 150 according to the third embodiment of the present technology.

MODE FOR CARRYING OUT THE INVENTION

Modes for carrying out the present technology (hereinafter, referred to as embodiments) will be described below. The description will be given in the following order.
1. First Embodiment (Example of Error Detection using Address Parity)
2. Second Embodiment (Example of Error Detection using Parity of Address Parity)
3. Third Embodiment (Example of Calculating DED using Address Parity)
4. Fourth Embodiment (Example of Providing Parity Generating Units Separately for Writing and Reading)
5. Application Examples 1. First Embodiment

Figure 1:
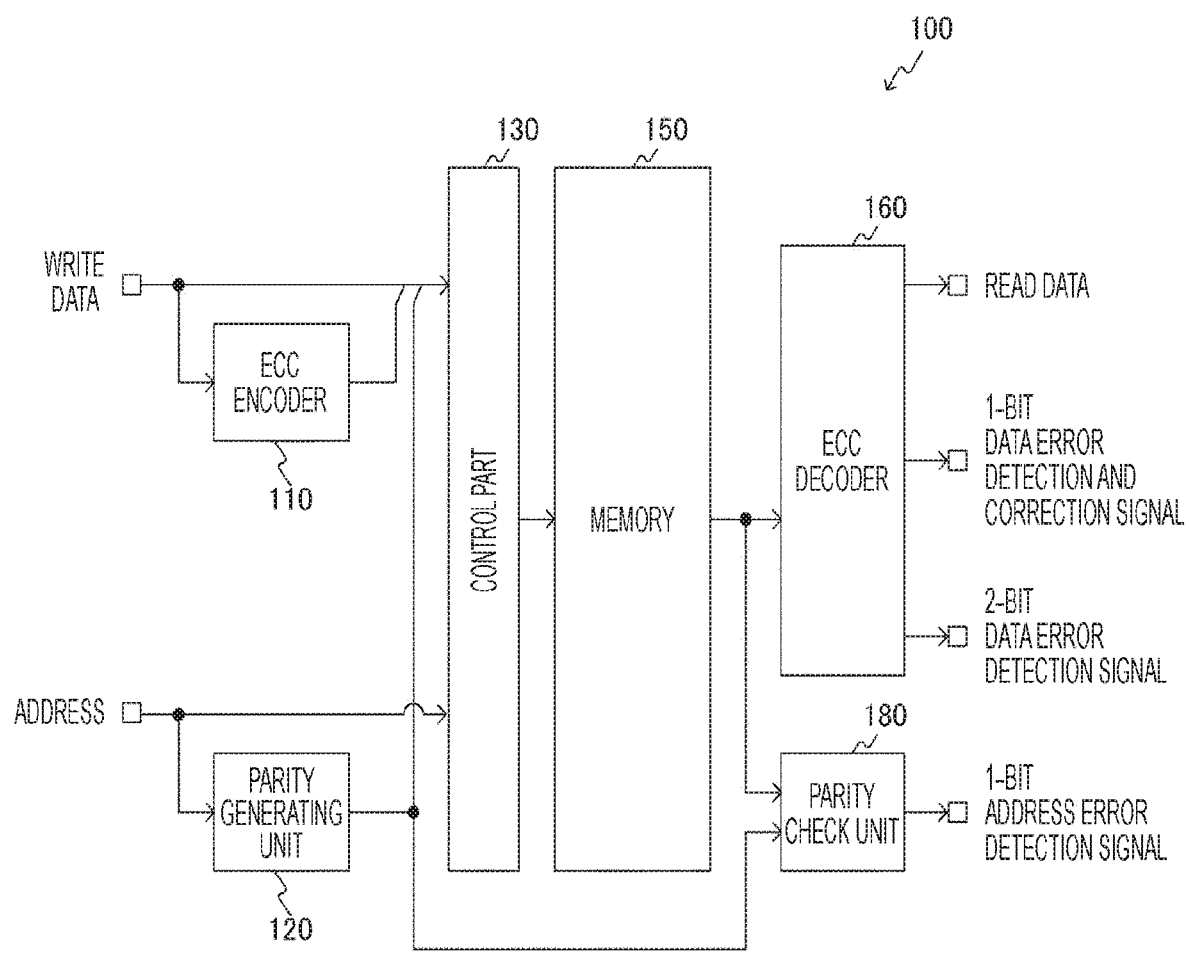
FIG. 1 is a diagram illustrating a configuration example of a storage apparatus 100 according to a first embodiment of the present technology.

[Configuration of Storage Apparatus]
FIG. 1 is a diagram illustrating a configuration example of a storage apparatus 100 according to a first embodiment of the present technology.

This storage apparatus 100 includes an ECC encoder 110, a parity generating unit 120, a control part 130, a memory 150, an ECC decoder 160, and a parity check unit 180.

The ECC encoder 110 performs error correction code (ECC) encoding processing on write access write data to generate an ECC. This ECC is a code for detecting and correcting an error relating to data. Note that the ECC encoder 110 is an example of a code generating unit described in the claims.

The parity generating unit 120 generates an address parity for error detection for a memory access memory address. Note that the parity generating unit 120 is an example of an address error detection information generating unit described in the claims, and the address parity generated by the parity generating unit 120 is an example of address error detection information described in the claims.

The control part 130 controls access to the memory 150. At the time of write access, this control part 130 stores the write data, the ECC generated by the ECC encoder 110, and the address parity generated by the parity generating unit 120 at an address indicated by a write address in the memory 150.

The memory 150 is a memory that stores data and other types of information. This memory 150 is constituted by a plurality of addressed entries (words), and a specific entry designated by the write address or the read address is selected to write or read the storage contents. For example, a static random access memory (SRAM) is supposed as this memory 150.

The ECC decoder 160 performs decoding processing on the data and the ECC that have been read to detect and correct an error at the time of read access. Here, it is supposed that the ECC functions include a function of detecting and correcting a 1-bit data error and a function of detecting a 2-bit data error. Note that the ECC decoder 160 is an example of an error detecting part described in the claims.

The parity check unit 180 detects an error at the time of read access by comparing the address parity generated for the read address with the address parity read from (stored in) the memory 150. In this example, by providing one bit as a parity for the address, a 1-bit address error can be detected. This address error detection includes an abnormality in an odd-numbered bit. Note that the parity check unit 180 is an example of the error detecting part described in the claims.

In addition, each member of the storage apparatus 100 described herein, excluding the memory 150, is an example of a storage control circuit described in the claims.

Figure 2:
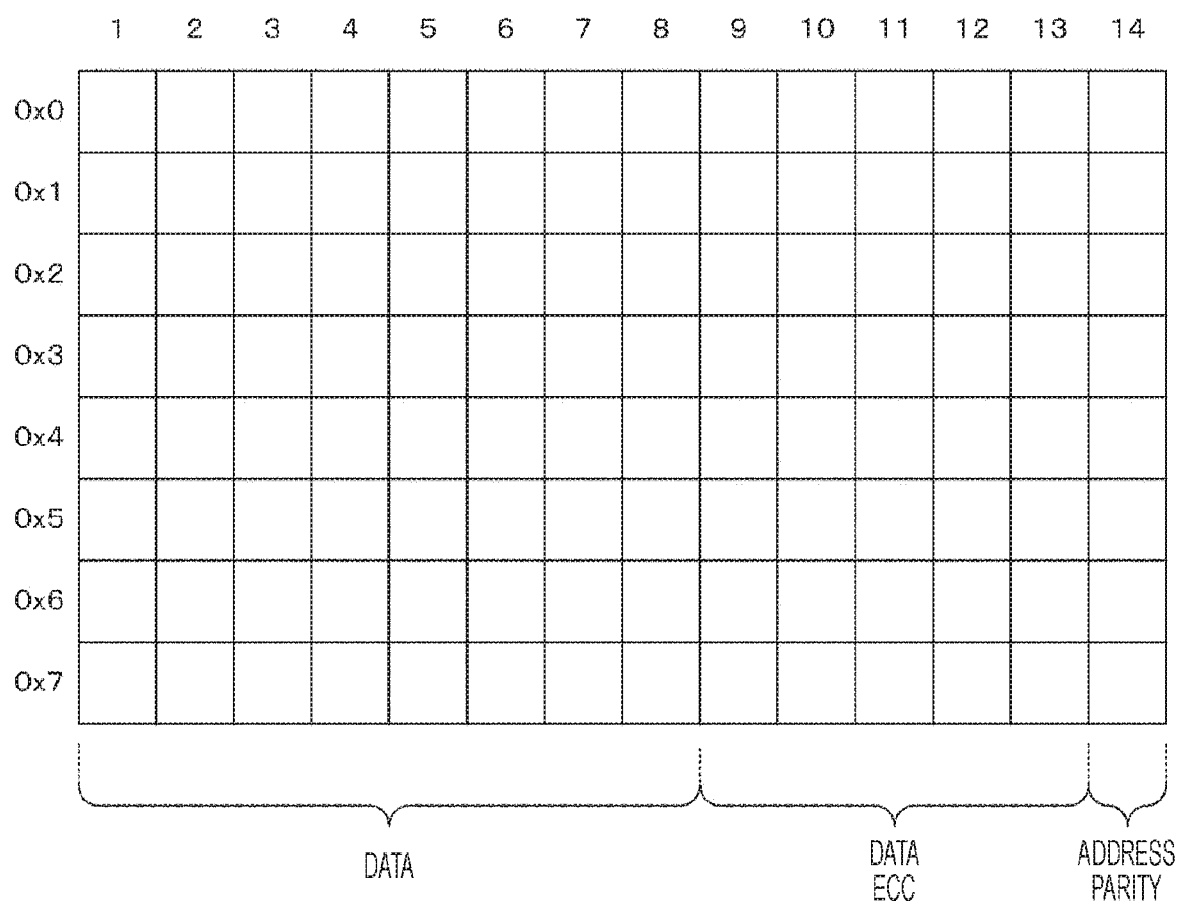
FIG. 2 is a diagram illustrating an example of storage contents of a memory 150 according to the first embodiment of the present technology.

[Storage Contents of Memory]
FIG. 2 is a diagram illustrating an example of storage contents of the memory 150 according to the first embodiment of the present technology.

In this example, the memory 150 is assumed to store 8-bit data and other types of information and to have eight entries, each of which is addressed. Note that "0x" means that the numbers following "0x" are in hexadecimal notation.

In the first to eighth bits of each entry, 8-bit data is stored. A 5-bit data ECC is stored in the ninth to thirteenth bits. A 1-bit address parity is stored in the fourteenth bit. That is, the address parity is stored in the memory 150 in association with the data. More specifically, the address parity is stored at the same address as the address of the data.

Regarding data, the ECC encoder 110 generates the 5-bit data ECC for 8-bit write data at the time of write access. Then, at the time of read access, the ECC decoder 160 decodes the 8-bit data and the 5-bit data ECC that have been read to detect and correct a 1-bit data error or to detect a 2-bit data error.

Regarding the address, the parity generating unit 120 generates a 1-bit address parity of the write address at the time of write access. Then, at the time of read access, the parity check unit 180 compares the 1-bit parity generated for the read address with the 1-bit parity read from the memory 150, and determines whether or not the two parities match. If the two parities match, it is determined that no address error has occurred. On the other hand, if the two parities do not match, it is determined that a 1-bit (or odd-numbered bit) address error has occurred.

[Working]

Figure 3:
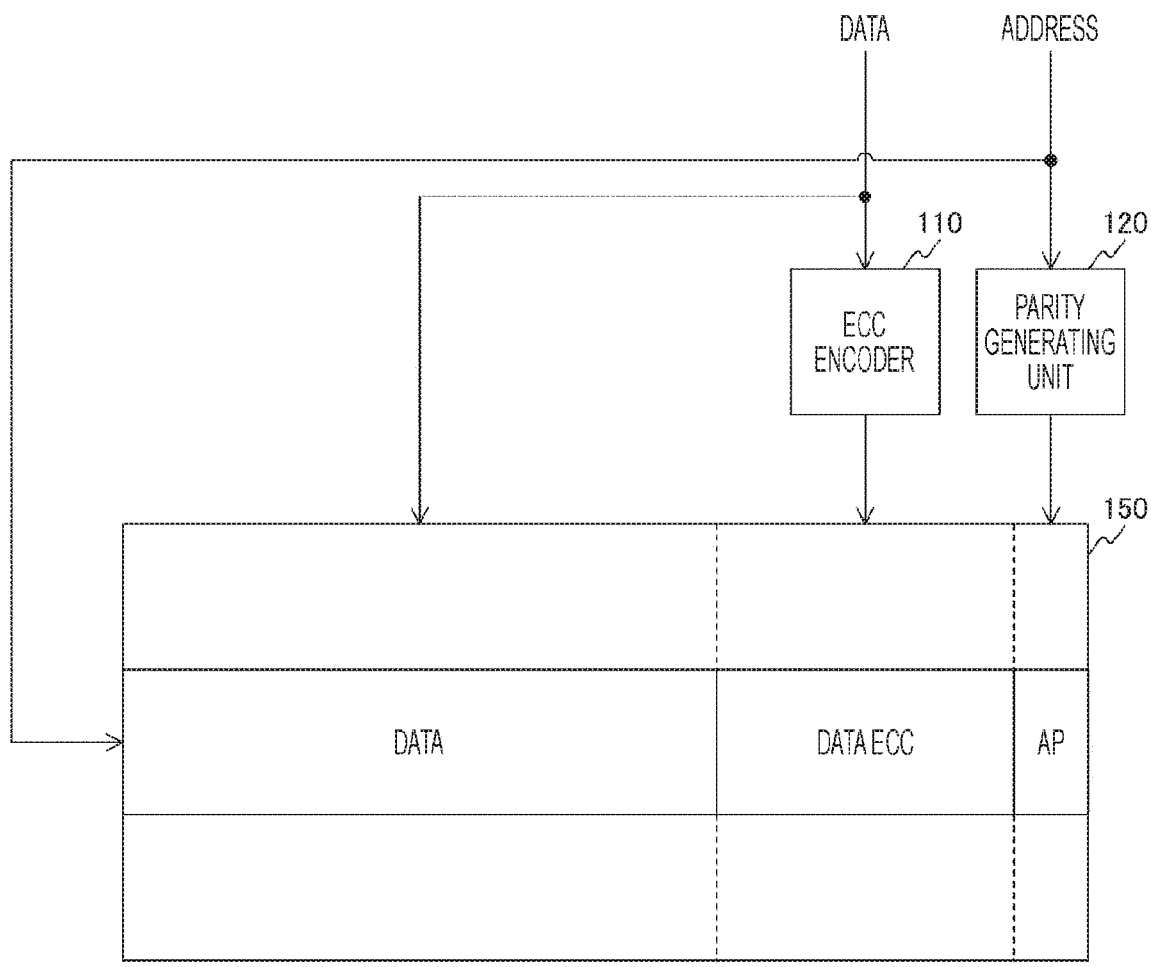
FIG. 3 is a diagram illustrating an example of a working outline at the time of write access according to the first embodiment of the present technology.

FIG. 3 is a diagram illustrating an example of a working outline at the time of write access according to the first embodiment of the present technology.

At the time of write access, the ECC encoder 110 generates the 5-bit data ECC for 8-bit write data. Furthermore, the parity generating unit 120 generates the 1-bit address parity of the write address. Then, these write data, data ECC, and address parity (AP) are stored in the memory 150 by the control part 130. The address in the memory 150 to be stored in this case is a write address in write access.

Figure 4:
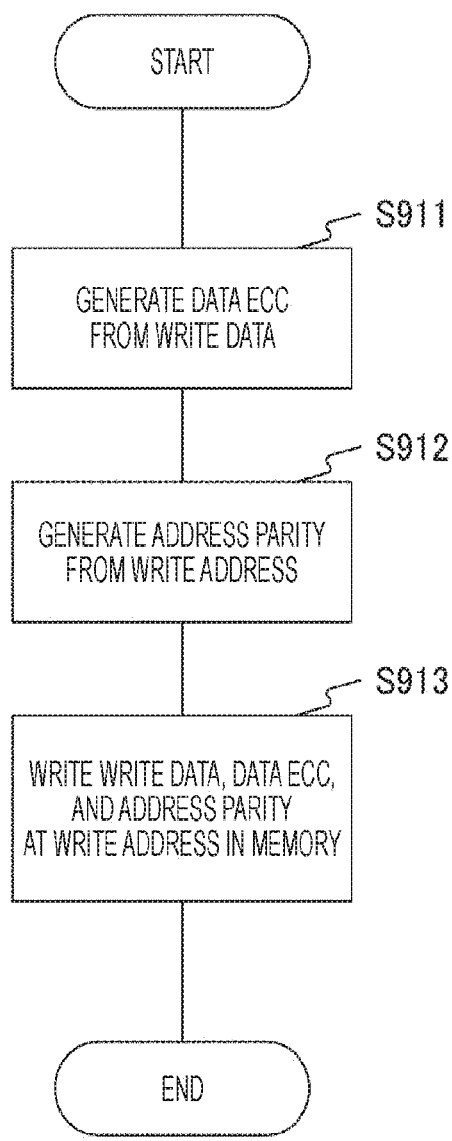
FIG. 4 is a flowchart illustrating an example of a processing procedure at the time of write access according to the first embodiment of the present technology.

FIG. 4 is a flowchart illustrating an example of a processing procedure at the time of write access according to the first embodiment of the present technology.

First, the ECC encoder 110 generates the 5-bit data ECC for 8-bit write data (step S911). Furthermore, the parity generating unit 120 generates the 1-bit address parity of the write address (step S912).

Then, the control part 130 writes the write data, the data ECC, and the address parity at the write address in the memory 150 (step S913).

Figure 5:
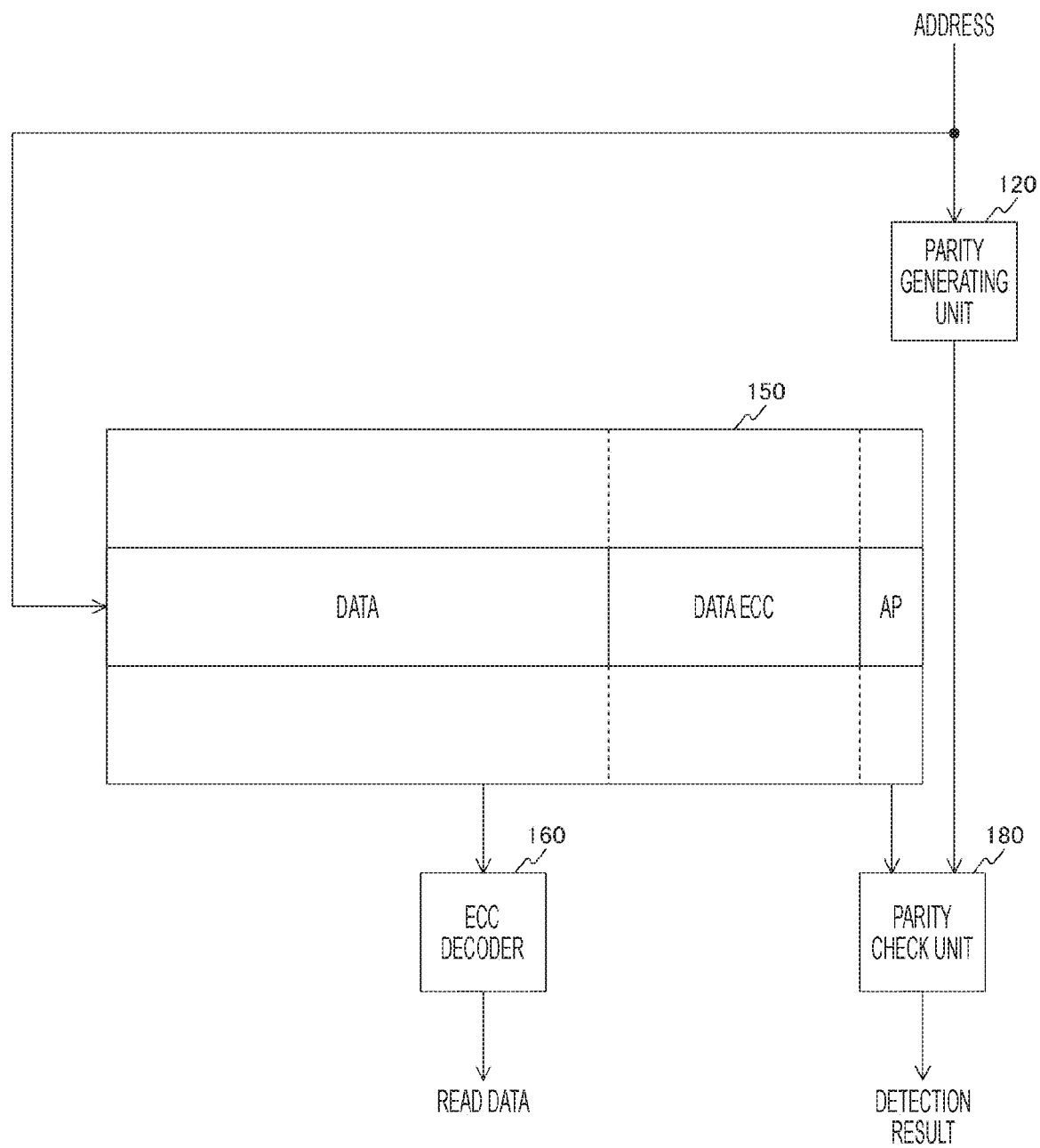
FIG. 5 is a diagram illustrating an example of a working outline at the time of read access according to the first embodiment of the present technology.

FIG. 5 is a diagram illustrating an example of a working outline at the time of read access according to the first embodiment of the present technology.

At the time of read access, the ECC decoder 160 decodes the 8-bit data and the 5-bit data ECC that have been read to detect and correct a 1-bit data error or to detect a 2-bit data error. Furthermore, the parity generating unit 120 generates the 1-bit address parity of the read address. Then, the parity check unit 180 compares the 1-bit address parity generated for the read address with the 1-bit address parity read from the memory 150 to detect an error.

Figure 6:
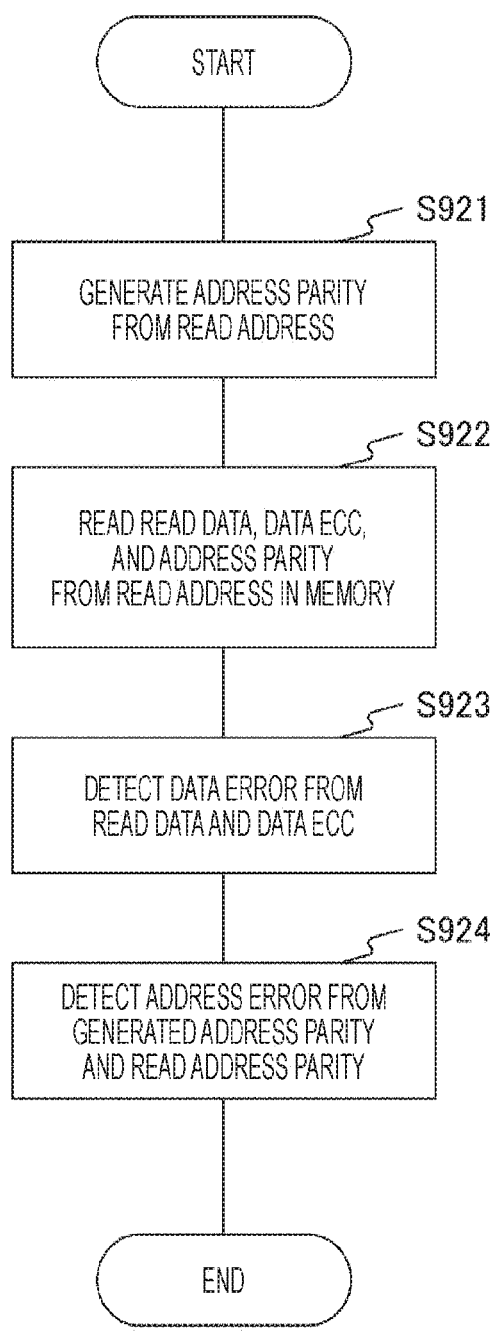
FIG. 6 is a flowchart illustrating an example of a processing procedure at the time of read access according to the first embodiment of the present technology.

FIG. 6 is a flowchart illustrating an example of a processing procedure at the time of read access according to the first embodiment of the present technology.

First, the parity generating unit 120 generates the 1-bit address parity from the read address (step S921). Furthermore, the 8-bit read data, the 5-bit data ECC, and the address parity are read from the read address in the memory 150 (step S922).

The ECC decoder 160 decodes the 8-bit data and the 5-bit data ECC that have been read to detect and correct a 1-bit data error or to detect a 2-bit data error (step S923).

Furthermore, the parity check unit 180 compares the 1-bit address parity generated for the read address with the 1-bit address parity read from the memory 150 to detect a 1-bit address error (step S924).

As a specific example, working in a case where a wrong address "0x6 (=0b0110)" is accessed in read access to a read address "0x2 (=0b0010)" will be described. Note that "0b" means that the numbers following "0b" are in binary notation.

When data corresponding to the wrong address "0x6" is read from the memory 150, the address parity of the wrong address is given as "0b0". On the other hand, the address parity generated by the parity generating unit 120 from the correct read address "0x2" is "0b1". When the parity check unit 180 compares the two parities, it is detected that an address abnormality has occurred, because the two parities do not match.

As described above, according to the first embodiment of the present technology, the 1-bit address error can be detected by storing the 1-bit address parity in the memory 150.

2. Second Embodiment

In the above-described first embodiment, the address error is detected by storing the 1-bit address parity in the memory 150. In this case, if a memory cell that stores the address parity is only in an abnormal state because of a soft error or the like due to the influence of radiation, there is no abnormality in the whole data or address, and thus it is originally desired to distinguish such a phenomenon by treating the phenomenon as not being an error state.

In order to distinguish this phenomenon, it is necessary to use an error detection code (EDC) capable of detecting a multiple-bit abnormality, instead of the 1-bit parity. In the second embodiment, two bits are reserved for address error detection, and a parity for the address parity is stored in a memory 150 in addition to the address parity. Note that these two bits including the parity for the address parity are an example of the address error detection information described in the claims.

In addition, the overall configuration of a storage apparatus 100 according to the second embodiment is basically similar to the overall configuration of the above-described first embodiment, and thus detailed description thereof will be omitted.

[Storage Contents of Memory]

Figure 7:
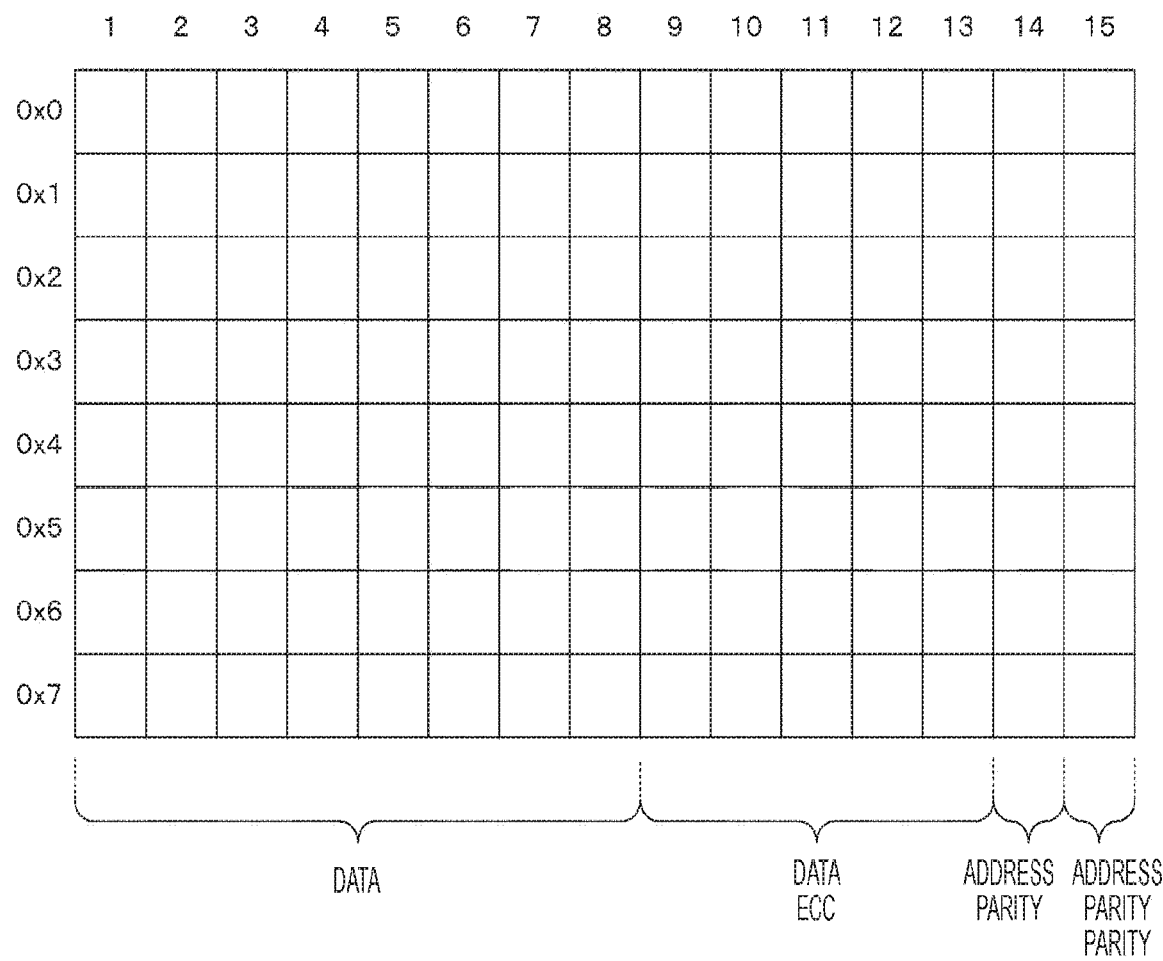
FIG. 7 is a diagram illustrating an example of storage contents of a memory 150 according to a second embodiment of the present technology.

FIG. 7 is a diagram illustrating an example of storage contents of the memory 150 according to the second embodiment of the present technology.

Each entry of the memory 150 in this second embodiment is similar to the entry in the first embodiment described above from the first bit to the fourteenth bit. Then, the parity of the address parity (fourteenth bit) is newly stored in the fifteenth bit. For example, if the address parity is "0b0", the parity of the address parity is given as "0b1". Furthermore, if the address parity is "0b1", the parity of the address parity is given as "0b0".

Figure 8:
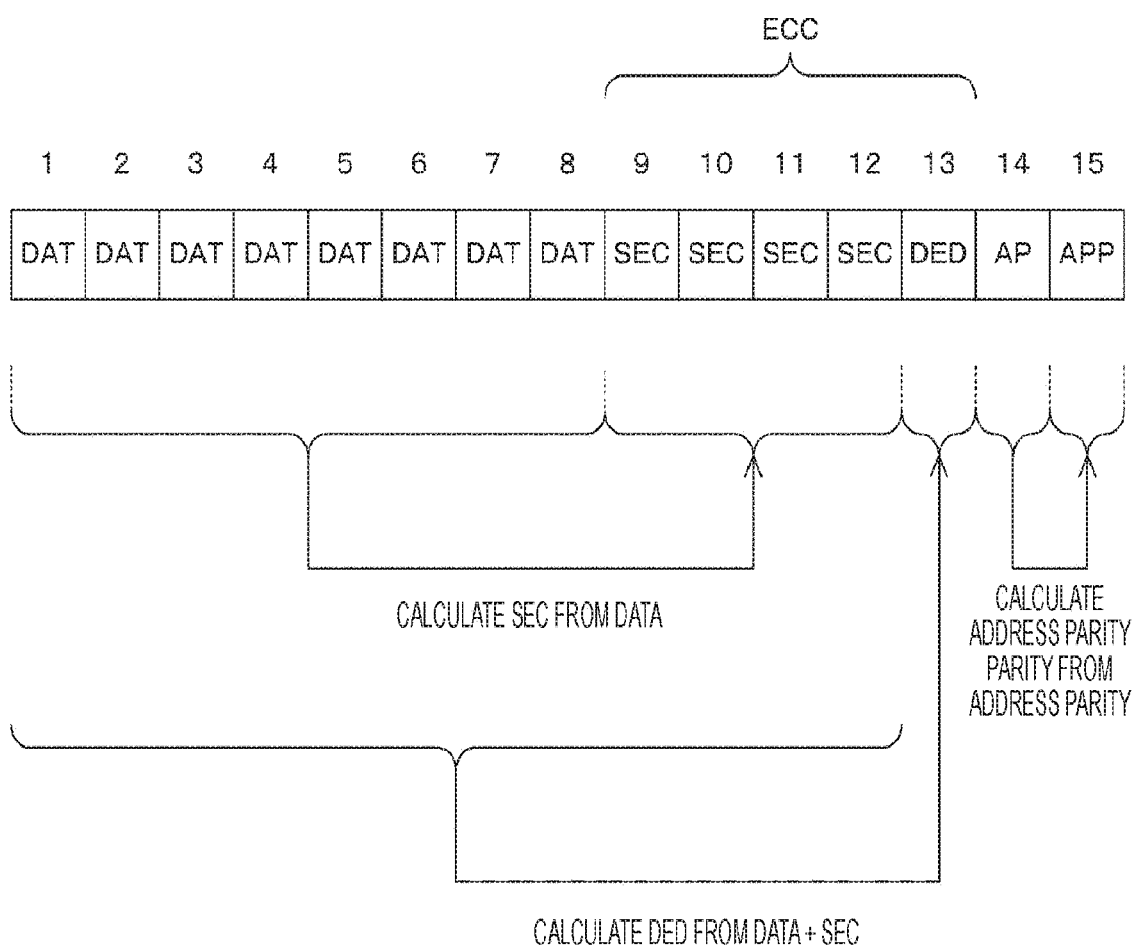
FIG. 8 is a diagram illustrating an example of a code calculation technique used in the second embodiment of the present technology.

FIG. 8 is a diagram illustrating an example of a code calculation technique used in the second embodiment of the present technology.

Here, the ECC is illustrated as two distinct types of ECC, namely, a 1-bit error detection and correction code (single-bit error correction (SEC)) and a 2-bit error detection code (double-bit error detection (DED)). That is, four bits from the ninth bit to the twelfth bit have the SEC, and one bit of the thirteenth bit has the DED. The 4-bit SEC is calculated from the 8-bit data. The 1-bit DED is calculated from the 8-bit data and the 4-bit SEC. Note that the ECC encoder 110 calculates these 4-bit SEC and 1-bit DED.

Furthermore, the fifteenth bit parity (APP) of the address parity is calculated from the fourteenth bit address parity (AP). As described earlier, in the normal state, the two parities should indicate the same value as a result. If the two parities do not match when read, it can be determined that the memory cell that stores the address parity is in an abnormal state because of a soft error or the like.

As described above, according to the second embodiment of the present technology, an abnormality in the memory cell that stores the address parity can be detected by storing the parity of the address parity in the memory 150. In this case, since there is no abnormality in the whole data or address, the abnormality in the memory cell can be distinguished by treating such an abnormality as not being a genuine error state.

3. Third Embodiment

In the above-described second embodiment, an abnormality in the memory cell that stores the address parity is detected by storing the parity of the address parity in the memory 150. In this case, it is necessary to reserve an extra 1-bit cell area for storing the parity of the address parity. In contrast to this, in this third embodiment, by inclusively incorporating the address parity in the DED calculation, the cell area for storing the parity of the address parity becomes unnecessary.

Note that the overall configuration of a storage apparatus 100 according to the third embodiment is basically similar to the overall configuration of the above-described first embodiment, and thus detailed description thereof will be omitted.

[Storage Contents of Memory]

Figure 9:
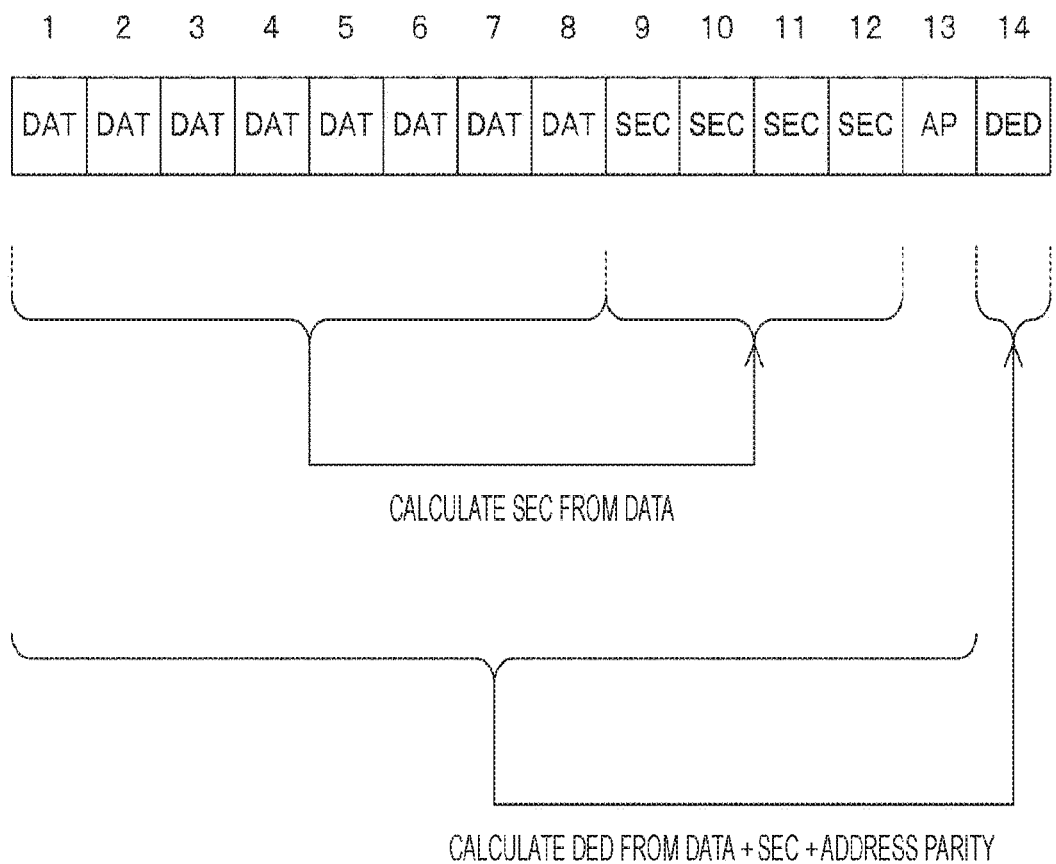
FIG. 9 is a diagram illustrating an example of a code calculation technique used in a third embodiment of the present technology.

FIG. 9 is a diagram illustrating an example of a code calculation technique used in the third embodiment of the present technology.

In this third embodiment, unlike the above-described second embodiment, the address parity is stored in the thirteenth bit and the DED is stored in the fourteenth bit. As for the calculation of the 4-bit SEC, the 4-bit SEC is calculated from the 8-bit data similarly to the second embodiment described above. However, in this third embodiment, the 1-bit DED is calculated from the 8-bit data, the 4-bit SEC, and the 1-bit address parity. That is, the address parity is fused into the existing ECC algorithm, and the address parity is inclusively incorporated in the DED calculation. This makes it possible to reflect the abnormality of the address parity in the DED while eliminating the need for the cell area for storing the parity of the address parity as in the second embodiment described above. Note that an ECC encoder 110 calculates these 4-bit SEC and 1-bit DED.

[Memory States]

FIG. 10 is a diagram illustrating an example of a truth table of states of a memory 150 according to the third embodiment of the present technology.

Here, the result of decoding by an ECC decoder 160 is indicated as a diagnosis result. If the memory 150 is in a normal state, the SEC, the address parity, and the DED all indicate "0" (case 1). Cases 2 to 5 are cases where the address parity is "0", which represent general SECDED failure detection. Furthermore, cases 6 to 9 are cases where the address parity is "1" and indicate a state in which an address error has been located.

In a case where a 1-bit failure occurs in data and the SEC, the address parity indicates "0", the DED indicates "1", and the SEC indicates "non-zero" (case 2). In this case, the failed 1 bit can be corrected.

In a case where a 1-bit failure occurs in the DED, the address parity indicates "0", the DED indicates "1", and the SEC indicates "0" (case 3). In this case, the whole data has no abnormality.

In a case where a 2-bit failure occurs in data and the SEC, the address parity indicates "0", the DED indicates "0", and the SEC indicates "non-zero" (case 4). In this case, the data cannot be corrected and it is found that a critical error has occurred. Furthermore, this similarly applies to a case where a 2-bit failure occurs in data, the SEC, and the DED (case 5).

In a case where a 1-bit failure occurs in the address parity, the address parity indicates "1", the DED indicates "1", and the SEC indicates "0" (case 6). In this case, the data has no abnormality and it is found that an error has occurred in the address parity cell.

In a case where a 2-bit failure occurs in data, the SEC and the address parity, the address parity indicates "1", the DED indicates "0", and the SEC indicates "non-zero" (case 7). In this case, it is found that, besides the address parity error, a 1-bit failure has occurred in the data and the SEC, and thus the failed 1-bit can be corrected.

In a case where a 2-bit failure occurs in the address parity and the DED, the address parity indicates "1", the DED indicates "0", and the SEC indicates "0" (case 8). Furthermore, also in the case of an address true error in which data has no abnormality and an error has occurred only in the address, the address parity indicates "1", the DED indicates "0", and the SEC indicates "0" (case 9). Case 9 is a state that should be treated as a critical error. Meanwhile, in case 8, the whole data has no abnormality and the normal working is actually possible; however, since the decoding result by the ECC decoder 160 is the same as in case 9, it is not possible to distinguish between the two cases. Therefore, case 8 is also treated as a critical error as in case 9.

As described above, according to the third embodiment of the present technology, in a case where a 2-bit failure occurs in the address parity and the DED, such a 2-bit failure cannot be distinguished from the address true error; nevertheless, a cell area for storing the parity of the address parity can be made unnecessary.

4. Fourth Embodiment

In the above-described first to third embodiments, the parity generating unit 120 generates the address parity for both of write access and read access. That is, the parity generating unit 120 is shared for write access and read access. In contrast to this, in this fourth embodiment, an example in which separate parity generating units for write access and read access are provided will be described.

[Configuration of Storage Apparatus]

Figure 11:
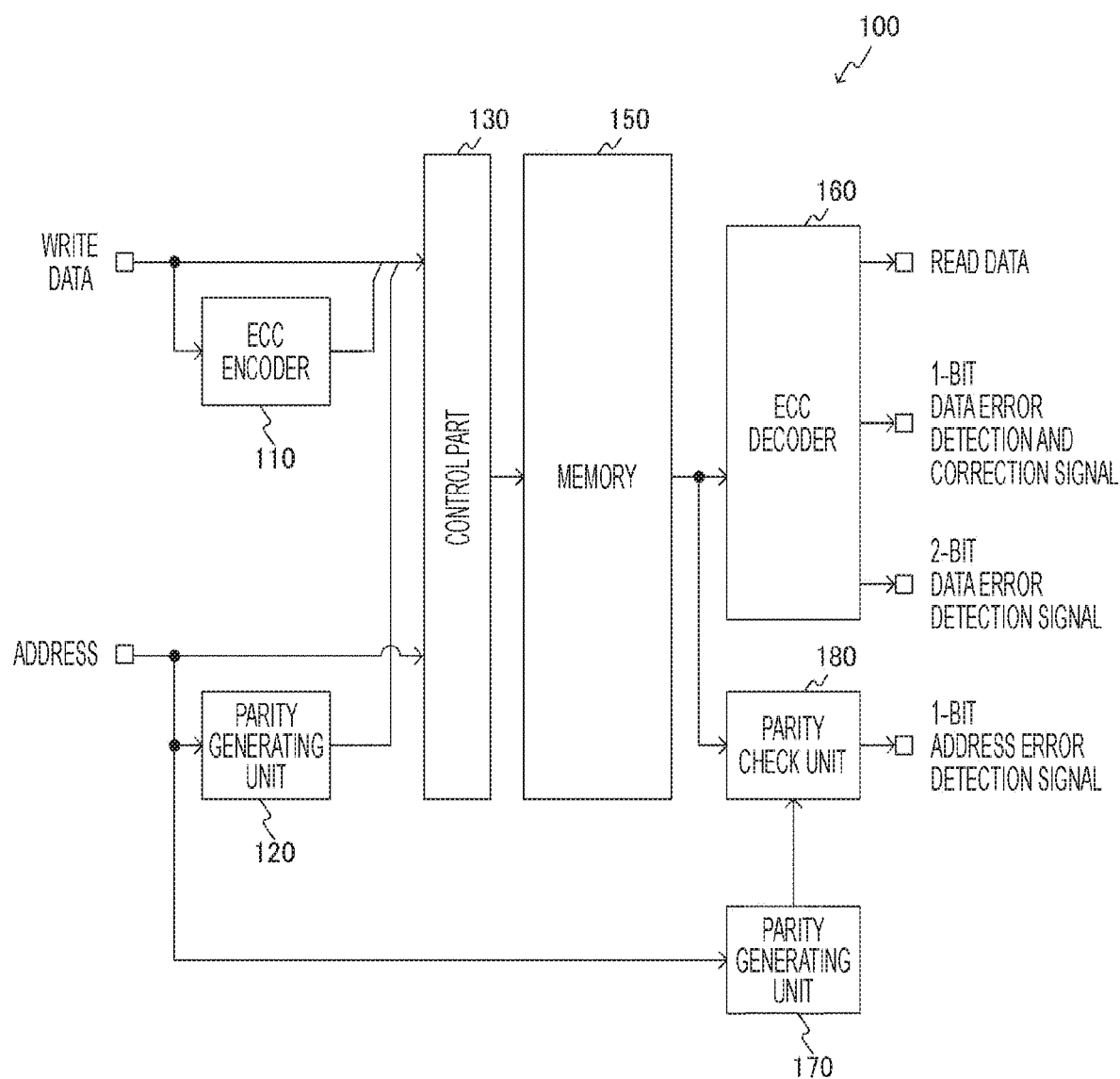
FIG. 11 is a diagram illustrating a configuration example of a storage apparatus 100 according to a fourth embodiment of the present technology.

FIG. 11 is a diagram illustrating a configuration example of a storage apparatus 100 according to the fourth embodiment of the present technology.

This storage apparatus 100 according to the fourth embodiment includes a parity generating unit 170 in addition to an ECC encoder 110, a parity generating unit 120, a control part 130, a memory 150, an ECC decoder 160, and a parity check unit 180. In this fourth embodiment, the parity generating unit 120 is used for address parity generation at the time of write access, and the parity generating unit 170 is used for address parity generation at the time of read access. The other features are similar to those of the first to third embodiments described above.

As described above, according to the fourth embodiment of the present technology, the parity generating unit 120 for write access and the parity generating unit 170 for read access are separately provided, and these two units can be controlled independently.

5. Application Examples

The storage apparatus 100 described in the above embodiments can be applied to a variety of products. For example, the technology according to the present disclosure may be implemented as an apparatus to be equipped in any type of moving body such as automobile, electric automobile, hybrid electric automobile, motorcycle, bicycle, personal mobility, airplane, drone, ship, robot, construction machine, and agricultural machine (tractor). Here, exemplary cases of applying to an imaging apparatus and a moving body control system will be described.

[Imaging Apparatus]

Figure 12:
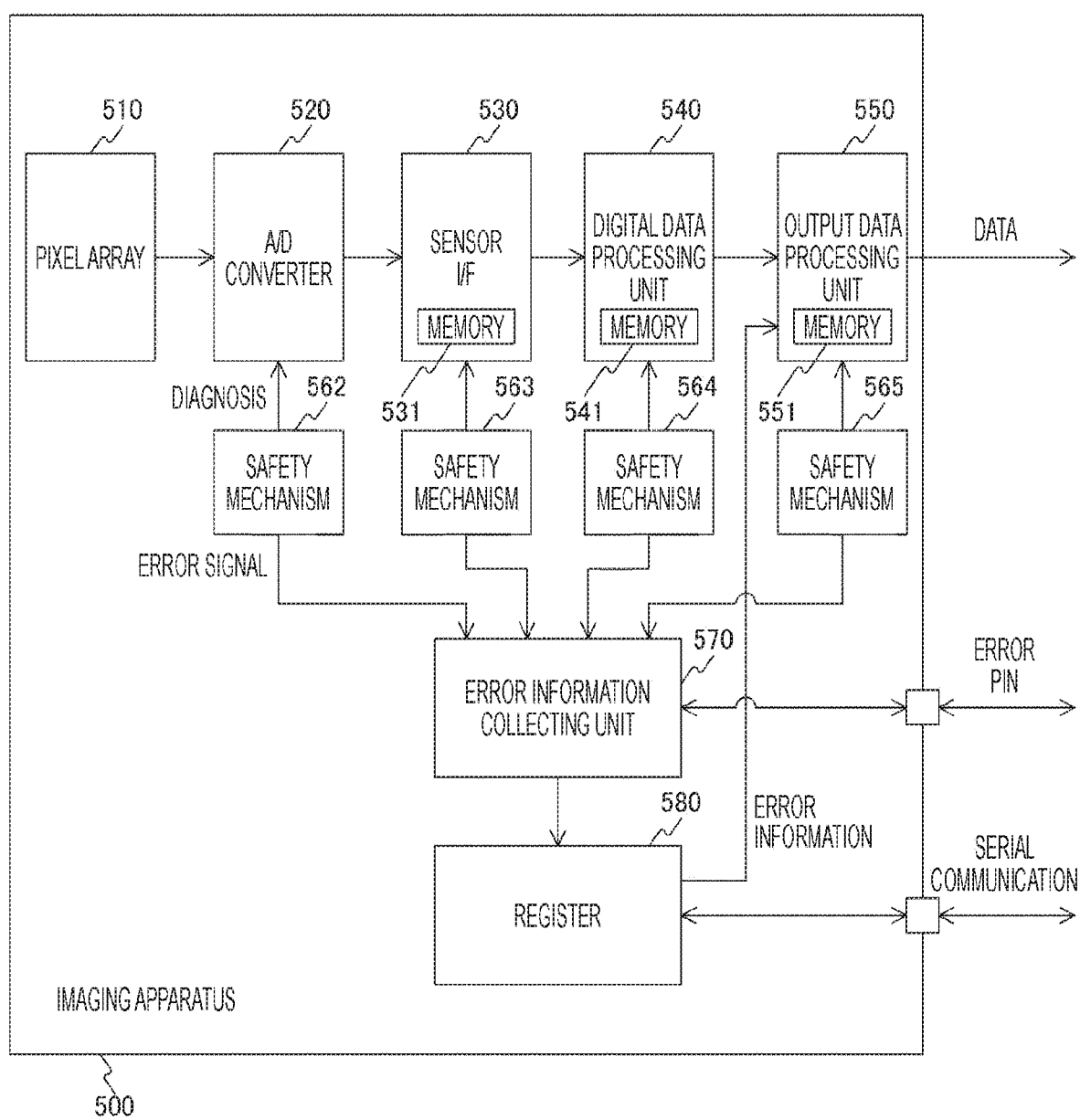
FIG. 12 is a diagram illustrating a configuration example of an imaging apparatus 500, which is an application example of the embodiments of the present technology.

FIG. 12 is a diagram illustrating a configuration example of an imaging apparatus 500, which is an application example of the embodiments of the present technology.

The imaging apparatus 500 images a subject and outputs the imaging data to a host computer (not illustrated). This imaging apparatus 500 can be utilized as, for example, an in-vehicle camera. This imaging apparatus 500 includes a pixel array 510, an analog-to-digital (A/D) converter 520, a sensor interface (I/F) 530, a digital data processing unit 540, and an output data processing unit 550. Furthermore, safety mechanisms 562 to 565 are provided in the A/D converter 520, the sensor I/F 530, the digital data processing unit 540, and the output data processing unit 550, respectively. In addition, this imaging apparatus 500 includes an error collecting unit 570 and a register 580.

The pixel array 510 is obtained by arranging pixels of an image sensor that images a subject, in an array form. Note that the pixel array 510 is an example of an image sensor described in the claims. The A/D converter 520 converts an imaging signal captured by the image sensor as the pixel array 510 from an analog value to a digital value. The sensor I/F 530 supplies the imaging signal converted into a digital value to the digital data processing unit 540 as digital data. The digital data processing unit 540 conducts predetermined signal processing on the digital data. The output data processing unit 550 outputs data on which the signal processing has been conducted, to the host computer.

The safety mechanisms 562 to 565 perform error diagnosis on the A/D converter 520, the sensor I/F 530, the digital data processing unit 540, and the output data processing unit 550, respectively. The error collecting unit 570 collects error signals detected by the safety mechanisms 562 to 565. The register 580 is a register that holds the error signal collected by the error collecting unit 570 as error information.

The sensor I/F 530, the digital data processing unit 540, and the output data processing unit 550 include memories 531, 541, and 551, respectively, and the technologies described in the above-described embodiments can be applied to these memories 531, 541, and 551. Then, the error signals detected in the memories 531, 541 and 551 are collected in the error collecting unit 570 via the safety mechanisms 563 to 565 and held in the register 580.

The error information held in the register 580 can be output to the host computer by the following three techniques, for example. Firstly, the error information can be embedded in the data by the output data processing unit 550 and output as embedded data. Secondly, the error information can be output from the error collecting unit 570 via an error pin. Thirdly, the error information can be output from the register 580 via serial communication (for example, an inter-integrated circuit (I2C)).

As described above, the storage apparatus 100 according to the embodiments of the present technology can be applied to the memories 531, 541, and 551 of the imaging apparatus 500.

[Moving Body Control System]

Figure 13:
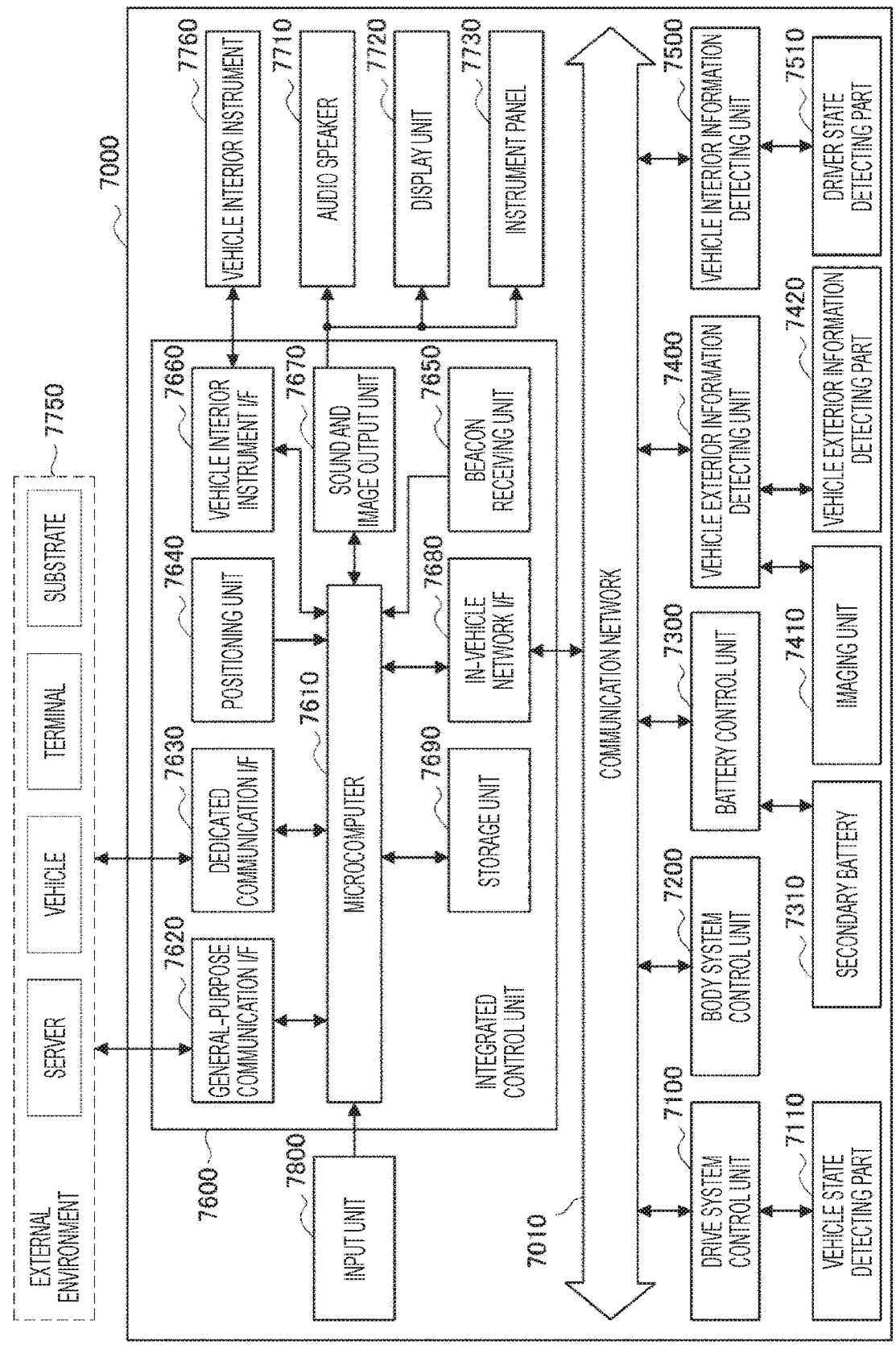
FIG. 13 is a block diagram illustrating an example of a schematic configuration of a vehicle control system, which is an application example of the embodiments of the present technology.

FIG. 13 is a block diagram illustrating a schematic configuration example of a vehicle control system 7000, which is an example of a moving body control system to which the technology according to the present disclosure can be applied. The vehicle control system 7000 includes a plurality of electronic control units connected via a communication network 7010. In the example illustrated in FIG. 13, the vehicle control system 7000 includes a drive system control unit 7100, a body system control unit 7200, a battery control unit 7300, a vehicle exterior information detecting unit 7400, a vehicle interior information detecting unit 7500, and an integrated control unit 7600. The communication network 7010 connecting this plurality of control units can be an in-vehicle communication network conforming to an arbitrary standard such as a controller area network (CAN), a local interconnect network (LIN), a local area network (LAN), and FlexRay (registered trademark), for example.

Each control unit includes a microcomputer that performs computational processing in accordance with various programs, a storage unit that stores programs executed by the microcomputer or parameters used for various computational tasks, and the like, and a drive circuit that drives various apparatuses to be controlled. Each control unit includes a network interface (I/F) for communicating with another control unit via the communication network 7010 and also includes a communication I/F for communicating with an apparatus or a sensor or the like inside and outside a vehicle by wired communication or wireless communication. In FIG. 13, a microcomputer 7610, a general-purpose communication I/F 7620, a dedicated communication I/F 7630, a positioning unit 7640, a beacon receiving unit 7650, a vehicle interior instrument I/F 7660, a sound and image output unit 7670, an in-vehicle network I/F 7680, and a storage unit 7690 are illustrated as a functional configuration of the integrated control unit 7600. Similarly, the other control units each include a microcomputer, a communication I/F, a storage unit, and the like.

The drive system control unit 7100 controls working of an apparatus related to a drive system of the vehicle in accordance with various programs. For example, the drive system control unit 7100 functions as control apparatuses such as a driving force generating apparatus for generating a driving force of the vehicle, such as an internal combustion engine or a driving motor, a driving force transmitting mechanism for transmitting a driving force to wheels, a steering mechanism that regulates a steer angle of the vehicle, and a braking apparatus that generates a braking force of the vehicle. The drive system control unit 7100 may have a function as a control apparatus such as an antilock brake system (ABS) or an electronic stability control (ESC).

A vehicle state detecting part 7110 is connected to the drive system control unit 7100. For example, the vehicle state detecting part 7110 includes a gyro sensor that detects an angular velocity of the axial rotational movement of a vehicle body, an acceleration sensor that detects the acceleration of the vehicle, or at least one of sensors for detecting an operation amount of an accelerator pedal, an operation amount of a brake pedal, a steering angle of a steering wheel, engine speed, a rotation speed of the wheel, or the like. The drive system control unit 7100 performs computational processing using a signal input from the vehicle state detecting part 7110 and controls the internal combustion engine, the driving motor, an electric power steering apparatus, a brake apparatus, or the like.

The body system control unit 7200 controls working of various apparatuses attached to the vehicle body in accordance with various programs. For example, the body system control unit 7200 functions as a keyless entry system, a smart key system, a power window apparatus, or a control apparatus for various lamps such as a headlamp, a back lamp, a brake lamp, a turn signal lamp, or a fog lamp. In this case, the body system control unit 7200 can accept input of a radio wave distributed from a portable device that substitutes a key or signals from various switches. The body system control unit 7200 accepts input of the above-mentioned radio wave or signals and controls a door lock apparatus, the power window apparatus, the lamp, and the like of the vehicle.

The battery control unit 7300 controls a secondary battery 7310, which is a power supply source of the driving motor, in accordance with various programs. For example, information such as a battery temperature, a battery output voltage, a remaining capacity of the battery, or the like is input to the battery control unit 7300 from a battery apparatus including the secondary battery 7310. The battery control unit 7300 performs computational processing using these signals and controls temperature regulation for the secondary battery 7310 or a cooling apparatus or the like included in the battery apparatus.

The vehicle exterior information detecting unit 7400 detects information outside the vehicle equipped with the vehicle control system 7000. For example, at least one of an imaging unit 7410 or a vehicle exterior information detecting part 7420 is connected to the vehicle exterior information detecting unit 7400. The imaging unit 7410 includes at least one of a time-of-flight (ToF) camera, a stereo camera, a monocular camera, an infrared camera, or other cameras. The vehicle exterior information detecting part 7420 includes at least one of, for example, an environmental sensor for detecting the current weather or meteorology, or an ambient information detecting sensor for detecting another vehicle, an obstacle, a pedestrian, and the like around the vehicle equipped with the vehicle control system 7000.

The environmental sensor can be, for example, at least one of a raindrop sensor for detecting rain, a fog sensor for detecting fog, a sunshine sensor for detecting sunshine degree, or a snow sensor for detecting snowfall. The ambient information detecting sensor can be at least one of an ultrasonic sensor, a radar apparatus, or a light detection and ranging or laser imaging detection and ranging (LIDAR) apparatus. The imaging unit 7410 and the vehicle exterior information detecting part 7420 described above may be each provided as an independent sensor or apparatus, or may be provided as an apparatus in which a plurality of sensors or apparatuses is integrated.

Figure 14:
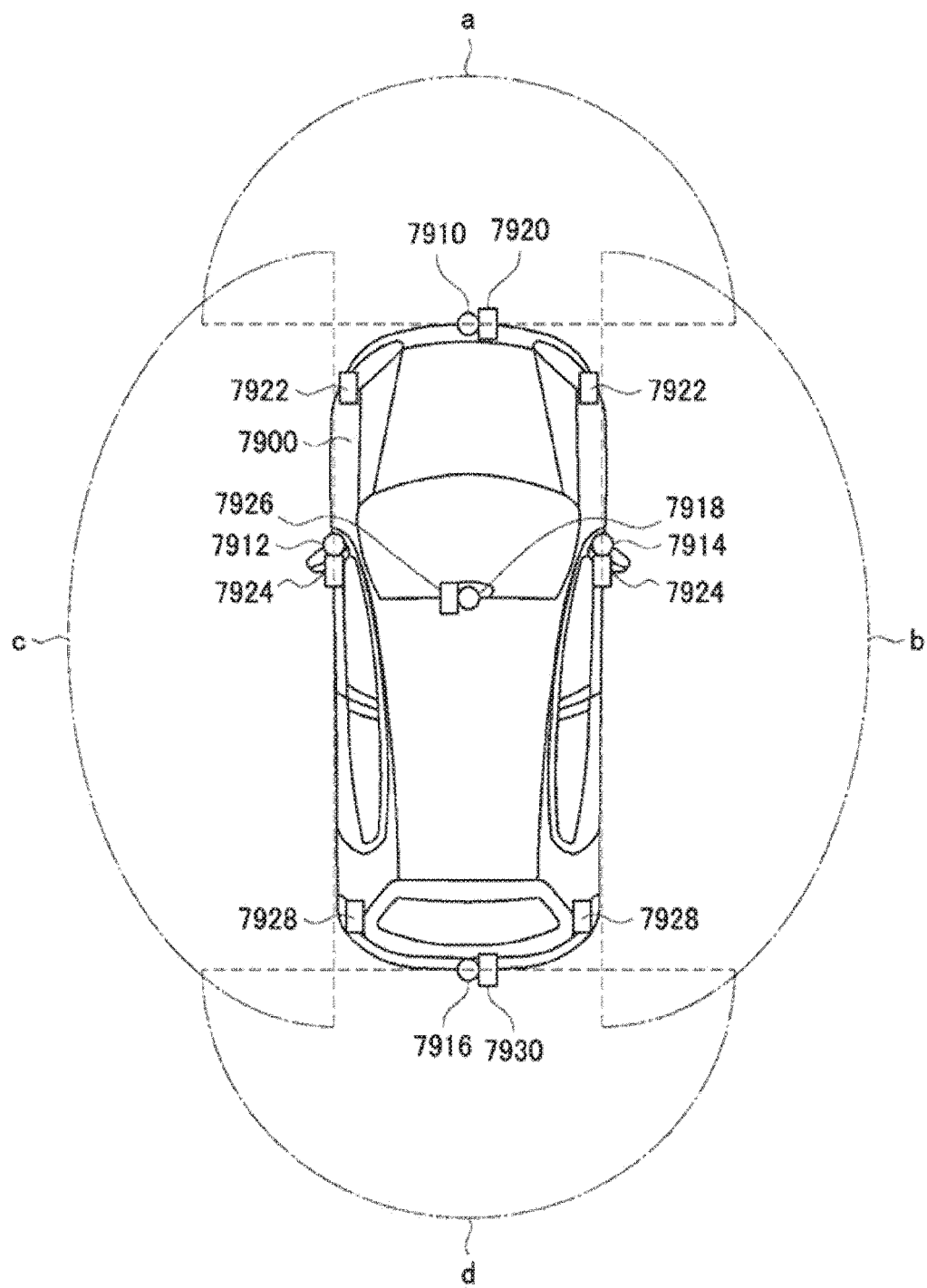
FIG. 14 is an explanatory diagram illustrating an example of installation positions of vehicle exterior information detecting parts and imaging units, which are application examples of the embodiments of the present technology.

Here, FIG. 14 illustrates an example of installation positions of the imaging units 7410 and the vehicle exterior information detecting parts 7420. For example, imaging units 7910, 7912, 7914, 7916, and 7918 are provided at at least one position of a front nose, a side mirror, a rear bumper, a back door, and an upper portion of a windshield in a passenger compartment of a vehicle 7900. The imaging unit 7910 provided at the front nose and the imaging unit 7918 provided at the upper portion of the windshield in the passenger compartment mainly acquire an image ahead of the vehicle 7900. The imaging units 7912 and 7914 provided at the side mirrors mainly acquire images of the sides of the vehicle 7900. The imaging unit 7916 provided at the rear bumper or the back door mainly acquires an image behind the vehicle 7900. The imaging unit 7918 provided at the upper portion of the windshield in the passenger compartment is mainly used for detecting a preceding vehicle, a pedestrian, an obstacle, a traffic signal, a traffic sign, a lane, and the like.

Note that FIG. 14 illustrates an example of capturing ranges of the respective imaging units 7910, 7912, 7914, and 7916. An imaging range a indicates an imaging range of the imaging unit 7910 provided at the front nose, imaging ranges b and c indicate imaging ranges of the imaging units 7912 and 7914 provided at the side mirrors, respectively, and an imaging range d indicates an imaging range of the imaging unit 7916 provided at the rear bumper or the back door. For example, by overlapping image data captured by the imaging units 7910, 7912, 7914, and 7916, an overhead view image of the vehicle 7900 viewed from above is obtained.

Vehicle exterior information detecting parts 7920, 7922, 7924, 7926, 7928, and 7930 provided at the front, rear, sides, corners, and the upper portion of the windshield in the passenger compartment of the vehicle 7900 can be, for example, ultrasonic sensors or radar apparatuses. The vehicle exterior information detecting parts 7920, 7926, and 7930 provided at the front nose, the rear bumper or the back door, and the upper portion of the windshield in the passenger compartment of the vehicle 7900 can be, for example, LIDAR apparatuses. These vehicle exterior information detecting parts 7920 to 7930 are mainly used for detecting a preceding vehicle, a pedestrian, an obstacle, and the like.

Returning to FIG. 13, the explanation will be continued. The vehicle exterior information detecting unit 7400 causes the imaging unit 7410 to capture an image of the outside of the vehicle and receives the captured image data. Furthermore, the vehicle exterior information detecting unit 7400 receives detection information from the connected vehicle exterior information detecting part 7420. In a case where the vehicle exterior information detecting part 7420 is an ultrasonic sensor, radar apparatus, or a LIDAR apparatus, the vehicle exterior information detecting unit 7400 causes the vehicle exterior information detecting part 7420 to distribute ultrasonic waves, electromagnetic waves, or the like, and receives information on reflected waves that have been received. The vehicle exterior information detecting unit 7400 may perform object detection processing or distance detection processing for a person, a car, an obstacle, a sign, a character on a road surface, or the like on the basis of the received information. The vehicle exterior information detecting unit 7400 may perform environment recognition processing for recognizing rainfall, fog, road surface condition, or the like on the basis of the received information. The vehicle exterior information detecting unit 7400 may calculate a distance to an object outside the vehicle on the basis of the received information.

Furthermore, the vehicle exterior information detecting unit 7400 may perform image recognition processing or distance detection processing for recognizing a person, a car, an obstacle, a sign, a character on a road surface, or the like on the basis of the received image data. The vehicle exterior information detecting unit 7400 may perform processing such as distortion correction or alignment on the received image data and also merge the image data captured by different imaging units 7410 to generate an overhead view image or a panoramic image. The vehicle exterior information detecting unit 7400 may perform viewpoint conversion processing using image data captured by different imaging units 7410.

The vehicle interior information detecting unit 7500 detects information inside the vehicle. For example, a driver state detecting part 7510 that detects the state of the driver is connected to the vehicle interior information detecting unit 7500. The driver state detecting part 7510 may include a camera that images the driver, a biometric sensor that detects biometric information on the driver, a microphone that gathers sound in the passenger compartment, and the like. The biometric sensor is provided, for example, on a seating surface or a steering wheel or the like and detects biometric information on an occupant sitting on a seat or the driver gripping the steering wheel. The vehicle interior information detecting unit 7500 may calculate the degree of fatigue or the degree of concentration of the driver or may discriminate whether or not the driver is dozing off, on the basis of detection information input from the driver state detecting part 7510. The vehicle interior information detecting unit 7500 may perform processing such as noise canceling processing on the gathered sound signal.

The integrated control unit 7600 controls the whole working of the vehicle control system 7000 in accordance with various programs. An input unit 7800 is connected to the integrated control unit 7600. The input unit 7800 is implemented by an apparatus that can be operated by an occupant to make input, such as a touch panel, a button, a microphone, a switch, or a lever, for example. The integrated control unit 7600 may accept input of data obtained by performing sound recognition on sound input by the microphone. The input unit 7800 may be, for example, a remote control apparatus that utilizes infrared rays or other radio waves, or an external connection instrument compatible with the operation of the vehicle control system 7000, such as a mobile phone or a personal digital assistant (PDA). The input unit 7800 may be, for example, a camera, in which case the occupant can input information by gesture. Alternatively, data obtained by detecting the motion of a wearable apparatus worn by the occupant may be input. Moreover, the input unit 7800 may include, for example, an input control circuit or the like that generates an input signal on the basis of information input by the occupant or the like using the above-described input unit 7800 and outputs the generated input signal to the integrated control unit 7600. By operating this input unit 7800, the occupant or the like inputs various types of data to the vehicle control system 7000 or instructs the vehicle control system 7000 on processing working.

The storage unit 7690 may include a read only memory (ROM) that stores various programs to be executed by the microcomputer, and a random access memory (RAM) that stores various parameters, computational results, sensor values, and the like. Furthermore, the storage unit 7690 may be implemented by a magnetic storage device such as a hard disc drive (HDD), a semiconductor storage device, an optical storage device, a magneto-optical storage device, or the like.

The general-purpose communication I/F 7620 is a communication I/F for general purposes that mediates communication with a variety of instruments present in an external environment 7750. The general-purpose communication I/F 7620 may be prepared with a cellular communication protocol such as global system of mobile communications (GSM) (registered trademark), WiMAX (registered trademark), long term evolution (LTE) (registered trademark), or LTE-Advanced (LTE-A), or other wireless communication protocols such as wireless LAN (also referred to as Wi-Fi (registered trademark)), or Bluetooth (registered trademark). The general-purpose communication I/F 7620 may connect to an instrument (for example, an application server or a control server) present on an external network (for example, the Internet, a cloud network, or a company's own network) via a base station or an access point, for example. Furthermore, the general-purpose communication I/F 7620 may use, for example, a peer-to-peer (P2P) technology to connect to a terminal present in the vicinity of the vehicle (for example, a terminal of the driver, a pedestrian, or a shop, or a machine type communication (MTC) terminal).

The dedicated communication I/F 7630 is a communication I/F supporting a communication protocol formulated for use in a vehicle. For example, the dedicated communication I/F 7630 can be prepared with a standard protocol such as wireless access in vehicle environment (WAVE) or dedicated short range communications (DSRC), which are a combination of the lower layer IEEE 802.11p and the upper layer IEEE 1609, or a cellular communication protocol. Typically, the dedicated communication I/F 7630 realizes vehicle-to-everything (V2X) communication, which is a concept including one or more of vehicle-to-vehicle communication, vehicle-to-infrastructure communication, vehicle-to-home communication, and vehicle-to-pedestrian communication.

For example, the positioning unit 7640 receives a global navigation satellite system (GNSS) signal from a GNSS satellite (for example, a global positioning system (GPS) signal from a GPS satellite) to execute positioning and generates position information including the latitude, longitude, and altitude of the vehicle. Note that the positioning unit 7640 may specify the current position by exchanging signals with a wireless access point or may acquire the position information from a terminal having a positioning function, such as a mobile phone, a personal handy-phone system (PHS), or a smartphone.

The beacon receiving unit 7650 receives, for example, radio waves or electromagnetic waves distributed from a wireless station or the like installed on the road and acquires information on the current position, congestion, road closure, required time, or the like. Note that the function of the beacon receiving unit 7650 may be included in the dedicated communication I/F 7630 described above.

The vehicle interior instrument I/F 7660 is a communication interface that mediates connection between the microcomputer 7610 and a variety of vehicle interior instruments 7760 present in the vehicle. The vehicle interior instrument I/F 7660 may establish a wireless connection using a wireless communication protocol such as wireless LAN, Bluetooth (registered trademark), near field communication (NFC), or wireless universal serial bus (WUSB). Furthermore, the vehicle interior instrument I/F 7660 may establish a wired connection such as a universal serial bus (USB), high-definition multimedia interface (HDMI) (registered trademark), or mobile high-definition link (MHL), via a connection terminal (not illustrated) (and a cable, if necessary). The vehicle interior instruments 7760 may include, for example, at least one of a mobile instrument or a wearable instrument carried by an occupant, or an information instrument brought in or mounted to the vehicle. In addition, the vehicle interior instruments 7760 may include a navigation apparatus that searches for a route to an arbitrary destination. The vehicle interior instrument I/F 7660 exchanges control signals or data signals with these vehicle interior instruments 7760.

The in-vehicle network I/F 7680 is an interface that mediates communication between the microcomputer 7610 and the communication network 7010. The in-vehicle network I/F 7680 transmits and receives signals and the like in compliance with a predetermined protocol supported by the communication network 7010.

The microcomputer 7610 of the integrated control unit 7600 controls the vehicle control system 7000 in accordance with various programs on the basis of information acquired via at least one of the general-purpose communication I/F 7620, the dedicated communication I/F 7630, the positioning unit 7640, the beacon receiving unit 7650, the vehicle interior instrument I/F 7660, or the in-vehicle network I/F 7680. For example, the microcomputer 7610 may compute a control target value for the driving force generating apparatus, the steering mechanism, or the braking apparatus on the basis of the acquired information inside and outside the vehicle, and output a control command to the drive system control unit 7100. For example, the microcomputer 7610 may perform coordinative control for the purpose of implementing the function of advanced driver assistance system (ADAS) including vehicle collision avoidance or impact mitigation, follow-up running based on inter-vehicle distance, vehicle speed maintenance running, vehicle collision warning, vehicle lane departure warning, or the like. Furthermore, the microcomputer 7610 may control the driving force generating apparatus, the steering mechanism, the braking apparatus, or the like on the basis of the acquired information around the vehicle so as to perform coordinative control for the purpose of, for example, the automatic driving in which the vehicle autonomously runs without depending on the operation by the driver.

On the basis of information acquired via at least one of the general-purpose communication I/F 7620, the dedicated communication I/F 7630, the positioning unit 7640, the beacon receiving unit 7650, the vehicle interior instrument I/F 7660, or the in-vehicle network I/F 7680, the microcomputer 7610 may generate three-dimensional distance information between the vehicle and a peripheral structure, an object such as a person, or the like, to create local map information including peripheral information on the current position of the vehicle. Furthermore, the microcomputer 7610 may generate a warning signal by predicting danger such as collision with a vehicle, a pedestrian or the like coming nearer, or entry into a road that is closed, on the basis of the acquired information. The warning signal can be, for example, a signal for generating a warning sound or for turning on a warning lamp.

The sound and image output unit 7670 transmits an output signal of at least one of a sound or an image to an output apparatus capable of visually or audibly notifying the occupant of the vehicle or the outside of the vehicle of information. In the example in FIG. 13, an audio speaker 7710, a display unit 7720, and an instrument panel 7730 are exemplified as output apparatuses. For example, the display unit 7720 may include at least one of an on-board display or a head-up display. The display unit 7720 may have an augmented reality (AR) display function. The output apparatus may be an apparatus other than the above-mentioned apparatuses, such as headphones, a wearable device such as a glasses-type display worn by the occupant, a projector, or a lamp. In a case where the output apparatus is a display apparatus, the display apparatus visually displays a result obtained by various types of processing performed by the microcomputer 7610 or information received from another control unit, in a variety of formats such as text, image, table, or graph. Furthermore, in a case where the output apparatus is a sound output apparatus, the sound output apparatus converts an audio signal made up of reproduced sound data, acoustic data, or the like into an analog signal and audibly outputs the converted analog signal.

Note that, in the example illustrated in FIG. 13, at least two control units connected via the communication network 7010 may be unified as one control unit. Alternatively, each control unit may be constituted by a plurality of control units. Moreover, the vehicle control system 7000 may include another control unit not illustrated. Furthermore, in the above description, some or all of the functions allocated to one of the control units may be given to another control unit. In other words, as long as information is transmitted and received via the communication network 7010, predetermined computational processing may be performed by any one of the control units. Similarly, a sensor or an apparatus connected to one of the control units may be connected to another control unit and also a plurality of control units may transmit and receive detection information with each other via the communication network 7010.

In the vehicle control system 7000 described above, the storage apparatus 100 according to the present embodiment can be applied to the storage unit 7690 in the integrated control unit 7600 of the application example illustrated in FIG. 13.

Note that the above-described embodiments illustrate examples for embodying the present technology and matters in the embodiments and invention specifying matters in the claims individually have correspondence relationships. Likewise, the invention specifying matters in the claims and the matters in the embodiments of the present technology denoted by the same names as those in the claims individually have correspondence relationships. However, the present technology is not limited to the embodiments and can be embodied by subjecting the embodiments to a variety of modifications without departing from the gist thereof.

Furthermore, the processing procedures described in the above embodiments may be regarded as a method having these series of procedures and additionally, may be regarded as a program for causing a computer to execute these series of procedures or as a recording medium storing the program. As this recording medium, for example, a compact disc (CD), a mini disc (MD), a digital versatile disc (DVD), a memory card, a Blu-ray (registered trademark) disc, or the like can be used.

Note that the effects described in the present description merely serve as examples and not construed to be limited. Furthermore, there may be another effect as well.

Note that the present technology can be also configured as described below.

(1) A storage control circuit including:

an address error detection information generating unit that generates address error detection information for detecting an error relating to an access address for a memory;

a control part that stores the generated address error detection information in the memory at a time of write access; and an error detecting part that compares the generated address error detection information with the address error detection information stored in the memory to detect an error at a time of read access.

(2) The storage control circuit according to (1) above, in which the control part stores the generated address error detection information in the memory in association with write data at the time of write access.

(3) The storage control circuit according to (1) or (2) above, in which the control part stores the generated address error detection information in the memory at a same address as an address of the write data at the time of write access.

(4) The storage control circuit according to any one of (1) to (3) above, in which the address error detection information includes an address parity which is a parity of the access address for the memory.

(5) The storage control circuit according to (4) above, in which the address error detection information further includes a parity of the address parity.

(6) The storage control circuit according to any one of (1) to (5) above, further including a code generating unit that generates a 2-bit error detection code from the write data, a 1-bit error correction code of the write data, and the address error detection information at the time of write access, in which the control part further stores the generated 2-bit error detection code in the memory at the time of write access.

(7) The storage control circuit according to (6) above, in which the error detecting part detects that an uncorrectable error has occurred, in a case where no error is detected by the 1-bit error correction code and the 2-bit error detection code and an error is detected by the address error detection information.

(8) The storage control circuit according to any one of (1) to (7) above, in which the address error detection information generating unit generates the address error detection information for both of write access and read access.

(9) The storage control circuit according to any one of (1) to (7) above, in which the address error detection information generating unit separately includes a write address error detection information generating unit that generates the address error detection information at the time of write access, and a read address error detection information generating unit that generates the address error detection information at the time of read access.

(10) A storage apparatus including:

a memory;

an address error detection information generating unit that generates address error detection information for detecting an error relating to an access address for the memory;

a control part that stores the generated address error detection information in the memory at a time of write access; and an error detecting part that compares the generated address error detection information with the address error detection information stored in the memory to detect an error at a time of read access.

(11) An imaging apparatus including:

an image sensor that images a subject;

a memory that stores a signal captured by the image sensor;

an address error detection information generating unit that generates address error detection information for detecting an error relating to an access address for the memory;

a control part that stores the generated address error detection information in the memory at a time of write access; and an error detecting part that compares the generated address error detection information with the address error detection information stored in the memory to detect an error at a time of read access.

(12) A storage control method including:

a procedure of generating address error detection information for detecting an error relating to an access address for a memory;

a procedure of storing the generated address error detection information in the memory at a time of write access; and a procedure of comparing the generated address error detection information with the address error detection information stored in the memory to detect an error at a time of read access.

REFERENCE SIGNS LIST

100 Storage apparatus
110 ECC encoder
120 Parity generating unit
130 Control part
150 Memory
160 ECC decoder
170 Parity generating unit
180 Parity check unit
500 Imaging apparatus
510 Pixel array
520 Analog-to-digital (A/D) converter
530 Sensor interface (I/F)
531, 541, 551 Memory
540 Digital data processing unit
550 Output data processing unit
570 Error collecting unit
580 Register
7690 Storage unit

The invention claimed is:

1. A storage control circuit, comprising:
an address error detection information generating unit configured to generate address error detection information for detection of an error relating to an access address for a memory;
a code generating unit configured to generate, at a time of write access in the memory, a 2-bit error detection code from write data and a 1-bit error correction code of the write data;
a control part configured to store, at the time of the write access, the generated address error detection information and the generated 2-bit error detection code in the memory; and
an error detecting part configured to compare address error detection information for a read address with the generated address error detection information stored in the memory to detect an error at a time of read access.

2. The storage control circuit according to claim 1, wherein the control part is further configured to store the generated address error detection information in the memory in association with the write data at the time of the write access.

3. The storage control circuit according to claim 1, wherein the control part is further configured to store, at the time of the write access, the generated address error detection information in the memory at a same address as an address of the write data.

4. The storage control circuit according to claim 1, wherein the address error detection information includes an address parity which is a parity of the access address for the memory.

5. The storage control circuit according to claim 4, wherein the address error detection information further includes a parity of the address parity.

6. The storage control circuit according to claim 1, wherein the error detecting part is further configured to detect an occurrence of an uncorrectable error, in a case where no error is detected by the 1-bit error correction code and the 2-bit error detection code and an error is detected by the address error detection information.

7. The storage control circuit according to claim 1, wherein the address error detection information generating unit is further configured to generate the address error detection information for each of the write access and the read access related to the read address.

8. The storage control circuit according to claim 1, wherein
the address error detection information generating unit separately includes a write address error detection information generating unit and a read address error detection information generating unit,
the write address error detection information generating unit is configured to generate the address error detection information at the time of the write access, and the read address error detection information generating unit is configured to generate the address error detection information at the time of the read access.

9. A storage apparatus, comprising:
a memory;
an address error detection information generating unit configured to generate address error detection information for detection of an error relating to an access address for the memory;
a code generating unit configured to generate, at a time of write access in the memory, a 2-bit error detection code from write data and a 1-bit error correction code of the write data;
a control part configured to store, at the time of the write access, the generated address error detection information and the generated 2-bit error detection code in the memory; and
an error detecting part configured to compare address error detection information for a read address with the generated address error detection information stored in the memory to detect an error at a time of read access.

10. An imaging apparatus, comprising:
an image sensor configured to image a subject;
a memory configured to store a signal captured by the image sensor;
an address error detection information generating unit configured to generate address error detection information for detection of an error relating to an access address for the memory;
a code generating unit configured to generate, at a time of write access in the memory, a 2-bit error detection code from write data and a 1-bit error correction code of the write data;
a control part configured to store, at the time of the write access, the generated address error detection information and the generated 2-bit error detection code in the memory; and
an error detecting part configured to compare address error detection information for a read address with the generated address error detection information stored in the memory to detect an error at a time of read access.

11. A storage control method, comprising:
in a storage control circuit:
generating address error detection information for detection of an error relating to an access address for a memory;
generating, at a time of write access in the memory, a 2-bit error detection code from write data and a 1-bit error correction code of the write data;
storing, at the time of the write access, the generated address error detection information and the generated 2-bit error detection code in the memory; and
comparing address error detection information for a read address with the generated address error detection information stored in the memory to detect an error at a time of read access.

12. A storage control circuit, comprising:
an address error detection information generating unit configured to generate address error detection information for detection of an error relating to an access address for a memory, wherein
the address error detection information generating unit separately includes a write address error detection information generating unit and a read address error detection information generating unit,
the write address error detection information generating unit is configured to generate the address error detection information at a time of write access, and
the read address error detection information generating unit is configured to generate the address error detection information at a time of read access;
a control part configured to store, at the time of the write access, the generated address error detection information in the memory; and
an error detecting part configured to compare the address error detection information generated for a read address with the generated address error detection information stored in the memory to detect an error at the time of the read access.

* * * * *